(12) United States Patent
Choi (10) Patent No.: US 8,624,612 B2
(45) Date of Patent: Jan. 7, 2014

(54) RF NON-CONTACT THIN FILM MEASUREMENT USING TWO PORT WAVEGUIDE

(75) Inventor: Mun Choi, Cerritos, CA (US)

(73) Assignee: Electronic Testing Services, LLC

( * ) Notice: Subject to any disclaimer, the term of this patent is extended or adjusted under 35 U.S.C. 154(b) by 660 days.

(21) Appl. No.: 12/816,184

(22) Filed: Jun. 15, 2010

(65) Prior Publication Data
US 2011/0304347 A1 Dec. 15, 2011

(51) Int. Cl.
*G01R 27/08* (2006.01)

(52) U.S. Cl.
USPC ............ 324/722; 324/637; 324/644; 324/636

(58) Field of Classification Search
USPC ....................................................... 324/722
See application file for complete search history.

(56) References Cited

U.S. PATENT DOCUMENTS

| | | | | |
|---|---|---|---|---|
| 4,492,915 A | * | 1/1985 | Caspers | ........................ 324/644 |
| 4,710,700 A | * | 12/1987 | Osaki et al. | .................... 324/631 |
| 2004/0138838 A1 | * | 7/2004 | Scheiner et al. | ................ 702/64 |
| 2008/0271776 A1 | * | 11/2008 | Morgan | ........................ 136/246 |

OTHER PUBLICATIONS

Sheet Resistance. Wikipedia, the free encyclopedia. May 5, 2010. <http://en.wikipedia.org/wiki/sheet_resistance> 3 pages.
Van der Pauw Method. Wikipedia, the free encyclopedia. May 5, 2010. <http://en.wikipedia.org/wiki/Van_der_Pauw_method> 8 pages.
Four-terminal Sensing. Wikipedia, the free encyclopedia. May 5, 2010. <http://en.wikipedia.org/wiki/Four-terminal_sensing> 3 pages.
Network Analyzer (Electrical). Wikipedia, the free encyclopedia. May 5, 2010. <http://en.wikipedia.org/wiki/Network_analyzer_(electrical)> 5 pages.
Surface Resistivity and Surface Resistance Measurements Using a Concentric Ring Probe Technique. Trek Application Note. No. 1005. Copyright 2003 TREK, Inc. 4 pages.
Scattering Parameters. Wikipedia, the free encyclopedia. May 5, 2010. <http://en.wikipedia.org/wiki/Scattering_parameters> 18 pages.
Product Data Sheet Rigid Waveguide. Mega Industries, LLC. <www.megaind.com> 6 pages.
Product Data Sheet Waveguide to Coaxial Transitions. Mega Industries, LLC. <www.megaind.com> 2 pages.
Waveguide Calibration Kit. Flann Microwave, Ltd. Copyright 2003. <www.flann.com> 7 pages.
Rigid Waveguide—Calibration Kits. Mega Industries, LLC. May 5, 2010. <http://megaind.com/waveguide/wgCalibrationKit.php> 1 page.
Waveguide. Wikipedia, the free encyclopedia. May 20, 2010. <http://en.wikipedia.org/wiki/Waveguide> 6 pages.

* cited by examiner

*Primary Examiner* — Arleen M Vazquez
*Assistant Examiner* — Alesa Allgood
(74) *Attorney, Agent, or Firm* — Stetina Brunda Garred & Brucker (57) ABSTRACT

The system disclosed herein for non-destructively testing a resistive film includes first and second waveguides that are gapped apart from each other. The resistive film is disposed between the first and second waveguides and tested. The film is then advanced and re-tested by the first and second waveguides. The waveguides do not contact the film during testing or while the film is being advanced to its next position. Accordingly, the system provides a non-destructive method of testing the sheet resistance of a film in an accurate manner.

8 Claims, 7 Drawing Sheets

RF NON-CONTACT THIN FILM MEASUREMENT USING TWO PORT WAVEGUIDE

CROSS-REFERENCE TO RELATED APPLICATIONS

Not Applicable

STATEMENT RE: FEDERALLY SPONSORED RESEARCH/DEVELOPMENT

Not Applicable

BACKGROUND

The present invention relates to a system and method for measuring sheet resistance of a thin film.

In electrical systems, at times, it is necessary to utilize a sheet of film that is resistant to electrical current. To fabricate these resistive films, tests must be conducted on the resistive films to ensure that sheet resistant throughout the film is at a certain level and is consistent throughout the entire film. Technology currently exists to test sheet resistance of the film. Unfortunately, existing technology suffers from certain deficiencies. In particular, existing technologies either (1) contact the film and destroy the same or (2) does not contact the film for testing but is inaccurate.

Accordingly, there is a need in the art for an improved method and system for testing sheet resistance of a resistive film (i.e., thin film coated with a resistive coating).

BRIEF SUMMARY

The system and method disclosed herein for testing sheet resistance of a resistive film addresses the needs discussed above, discussed below and those that are known in the art.

The testing system includes first and second waveguides gapped apart from each other. The resistive film is disposed between the first and second waveguides and does not contact the waveguides. As such, the film is not damaged through testing. The film may be held between two rollers that are advanced in unison so that the entire roll of film may be tested. The first and second waveguides are gapped apart sufficiently from each other so that the film does not contact the waveguides when the rollers are being advanced during testing. Moreover, it is preferable that the first and second waveguides be placed as close to each other as possible to the extent that the film does not contact the waveguides during advancement and testing of the film to facilitate more accurate readings.

The system may include one or two probe stations each comprising first and second waveguides. These two probe stations measure the E-field and H-field of the film. In order to ensure that the waveguides test the entire width of the roll of film, the first and second waveguides may each be divided into first and second rows of waveguides. The first row of waveguides are aligned to each other across the width of the film. Any gap between the waveguides of the first row is covered by the waveguides of the second row. In this manner, the entire width of the film is tested.

More particularly, a measurement system for testing a resistive film is disclosed. The system may comprise a first waveguide, a second waveguide and a network analyzer. The second waveguide may be gaped away from the first waveguide. The film may be disposed between the first and second waveguides and spaced away from the first and second waveguides. The network analyzer may be in electrical communication with the first and second waveguides for measuring S parameters of the film wherein the measured S parameters of the film are converted to a sheet resistance value to determine whether the sheet resistance of the film is within tolerance.

The first and second waveguides may be oriented vertically so that the film is placed in a horizontal orientation between the first and second waveguides. The first and second waveguides may be mounted to a bench. The system may also further comprise first and second stepper motors mounted to the bench with the stepper motors operative to unwind a roll of the film between the first and second waveguides for non destructive testing.

The first and second waveguides may be gaped away from each other about 0.030 inches to about one (1) inch. Preferably, the first and second waveguides are gaped away from each other about 0.030 inches to about 0.300 inches.

The system may further comprise an array of first waveguides. The array of first waveguides may have upstream and downstream rows of first waveguides. The upstream row of first waveguides may be disposed at a gap formed between two waveguides of the downstream row of first waveguides. The measurement system may also further comprise an array of second waveguides corresponding to the array of first waveguides. The array of second waveguides may be disposed opposite the film.

The measurement system may further comprise an E field set of first and second waveguides and an H field set of first and second waveguides which may be mounted to the bench.

Additionally, a method of measuring resistivity of a resistive film is disclosed. The method may comprise the steps of disposing the resistive film between first and second waveguides; adjusting the film so that the film is spaced away from the first and second waveguides; measuring sheet resistance of the film with the first and second waveguides while the film is spaced away from the first and second waveguides; and feeding the film between the first and second waveguides without touching the first and second waveguides.

The measuring step may comprise the steps of: measuring an E field with an E field set of first and second waveguides; and measuring an H field with an H field set of first and second waveguides in order to detect any form of damage on the film.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Referring now to the drawings, a RF non-contact thin film measurement system 10 using a two port waveguide is shown.

A resistive film 12 may be disposed between two waveguide 14a, 15a. The waveguides 14a, 15a are gapped away from each other by distance 16. The film 12 is disposed between the waveguides 14a, 15a and does not touch the waveguides 14a, 15a. The waveguides 14a, 15a transmit electromagnetic forces to the film 12. S-parameters of the film 12 are measured by a vector network analyzer 18 and sent to a computer 20 to derive a sheet resistance value of the area of the film 12 being measured to determine whether the resistivity of the film 12 is within tolerance. Beneficially, the waveguides 14a, 15a do not contact the film 12 and do not destroy the film 12, and damage to the film 12 is detected. Accordingly, a resistive film 12 having a long length is achievable since the film 12 is not destroyed along the entire length of the roll 22 of film 12 as the roll 22 of film 12 is being tested.

Figure 1:
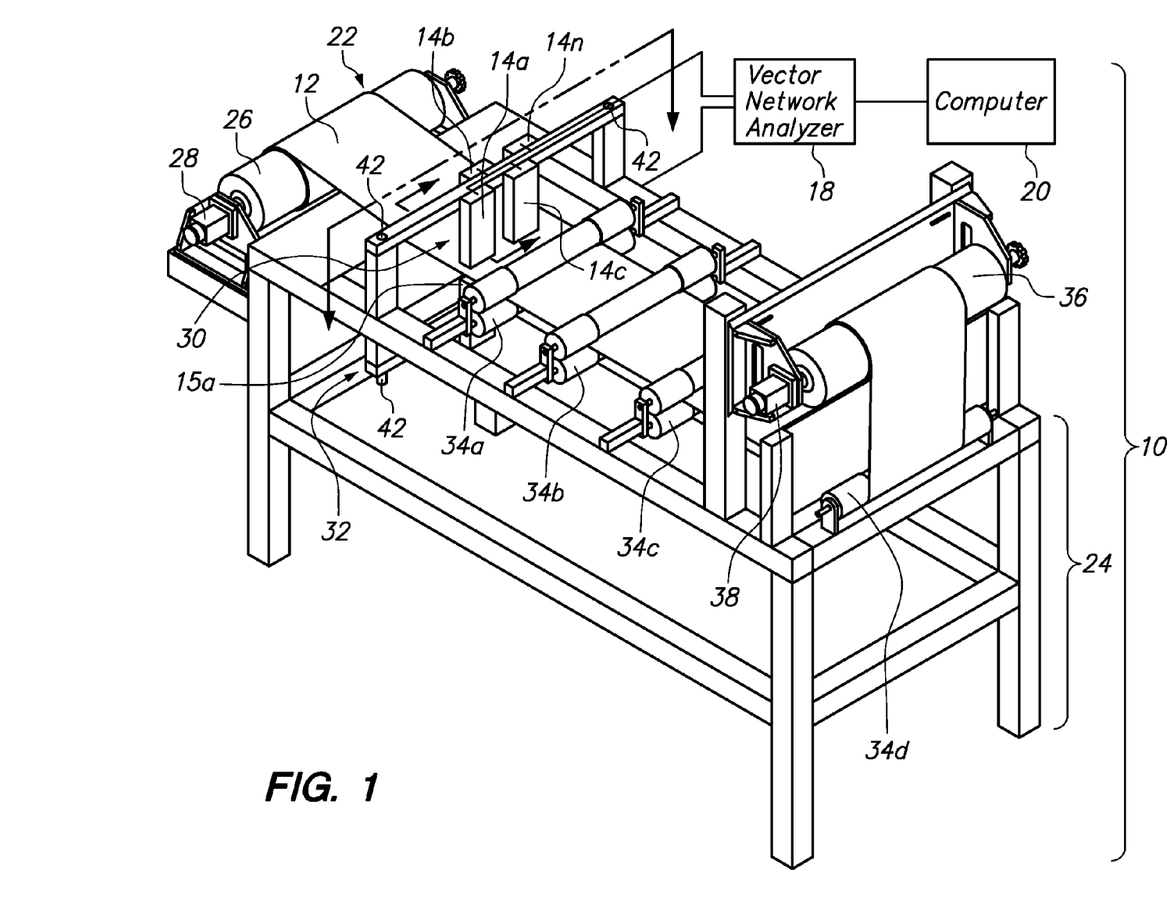
FIG. 1 is a perspective view of a RF non contact thin film measurement system using two port waveguide.

Referring now to FIG. 1, the system 10 may include a stand 24. The roll 22 of film 12 may be mounted to a roller 26. The roller 26 may be incrementally advanced by way of stepper motor 28. The film 12 may be hand fed through an upper array 30 of waveguides 14a-n and a lower array 32 of waveguides 15a-n. The film 12 may be passed through a set of rollers 34a-d to guide the film 12 to roller 36. The roller 36 may also be advanced by way of stepper motor 38. As discussed above, the film 12 does not contact the upper and lower arrays 30, 32 of the waveguides 14a-n, 15a-n. The stepper motors 28, 38 advance film 12 in unison so that the film 12 does not sag too much thereby touching the lower array 32 of the waveguides 15a-n or place too much tension in the film 12 thereby causing the film 12 to contact the upper array 30 of the waveguides 14a-n.

Figure 2:
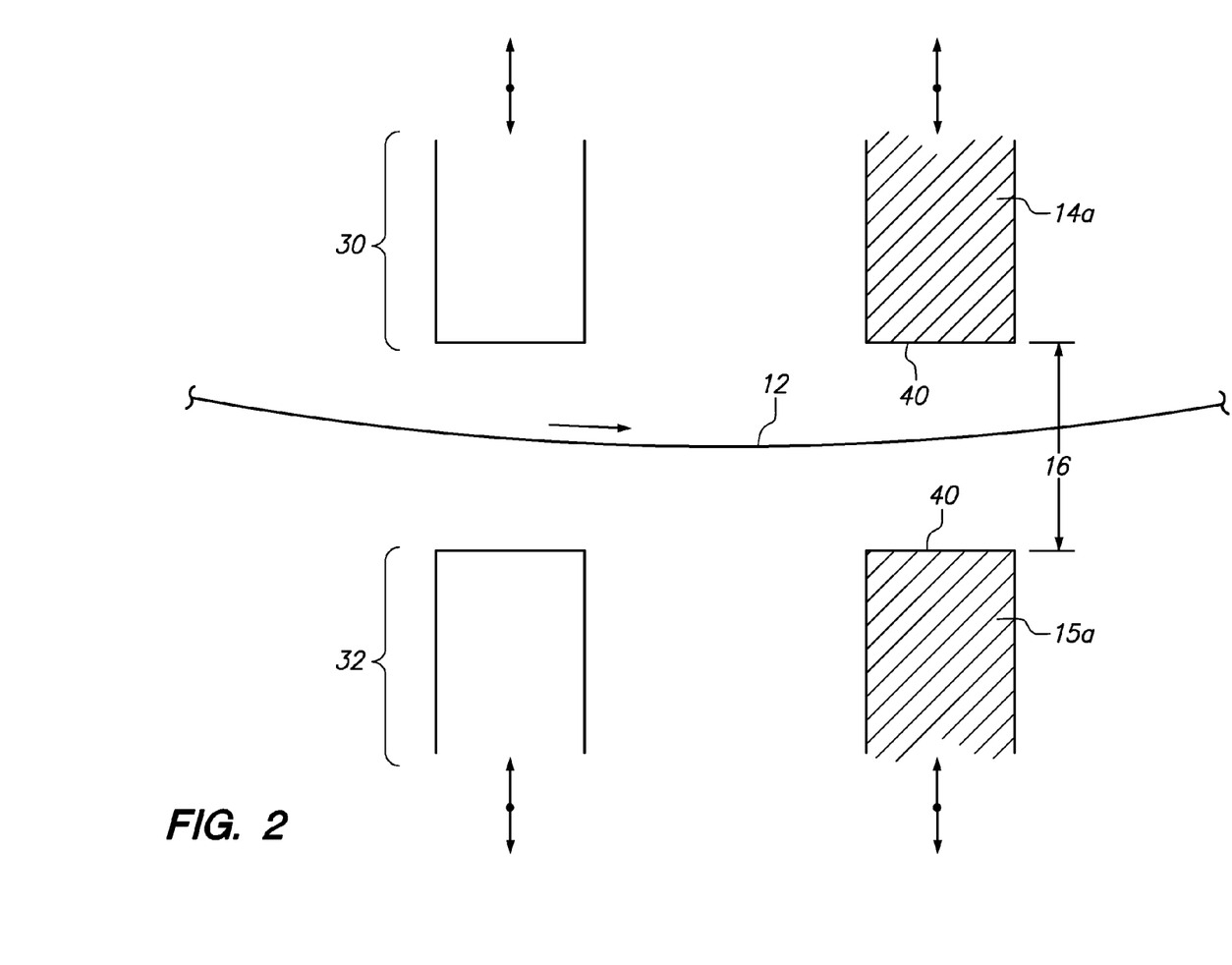
FIG. 2 is a cross sectional view of a film suspended between upper and lower arrays of waveguides.

Referring now to FIG. 2, the distal end 40 of the waveguides 14a-n and the distal ends 40 of the waveguides 15a-n define the distance 16. The upper array 30 of the waveguides 14a-n may be adjusted further away or closer to the lower array 32 of the waveguides 15a-n by way of adjustment nut 42 (see FIG. 1). By turning the adjustment nuts 42, the upper and lower arrays 30, 32 of the waveguides 14a-n and 15a-n may be adjusted closer to or away from each other. In the example shown in FIG. 1, the adjustment nuts 42 adjust the vertical height of the waveguides 14, 15. The distance 16 may be large enough so that the film 12 does not contact the upper or lower arrays 30, 32 of the waveguides 14, 15 as the film 12 is being fed therebetween but also close enough to provide a sufficiently accurate resistance value of the film 12. By way of example and not limitation, the distance 16 may be between about 0.030 inch to about 1 inch. Preferably, the distance 16 is adjusted to be between about 0.030 inch to about 0.300 inch.

Figure 3:
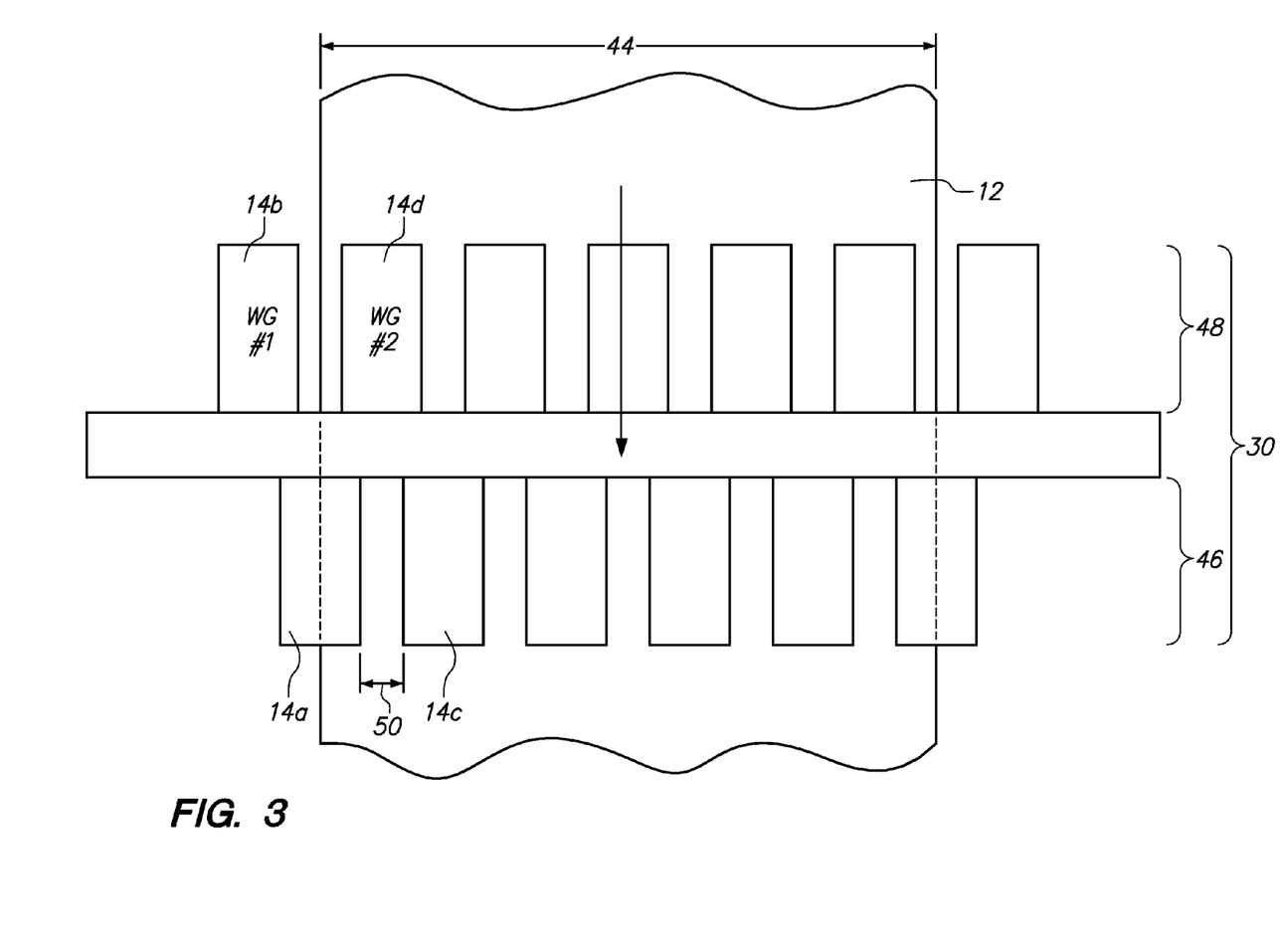
FIG. 3 is a top view of a first set of waveguides (or first probe station) for testing and H-field of the film.

Referring now to FIG. 3, the upper array 30 of waveguides 14a-n is shown. Only waveguides 14a-d are identified. However, the waveguides 14a-n may be set up so as to extend across the entire width 44 of the film 12. A plurality of waveguides 14a-n may be set up in two different rows 46, 48. The first row 46 of waveguides 14a, c, n may be positioned adjacent to each other. Due to physical constraints of the waveguide 14a, c, n, there is a gap 50 between each adjacent waveguide 14a, c, etc. The waveguide 14a measures the resistivity of the film 12 only at the footprint of the waveguide 14a on the film 12. The resistivity of the film 12 is not measured at the gap 50 by the first row 46 of waveguides 14a, c-n. Accordingly, any defects in the film 12 along this area of the film 12 are not detected by the first row 46 of waveguides 14a, c-n. To catch defects within the gap area 50 of the film 12, the second row 48 of waveguides 14b, d-n are positioned at the gap 50 and overlap with the waveguides 14a, c-n of the first row 46. In this manner, the entire width 44 of the film 12 is tested. If the film 12 width 44 is wider, then additional waveguides 14a-n may be set up across the width of the stand 24 so that the entire width 44 is covered by waveguides 14a-n.

Figure 4:
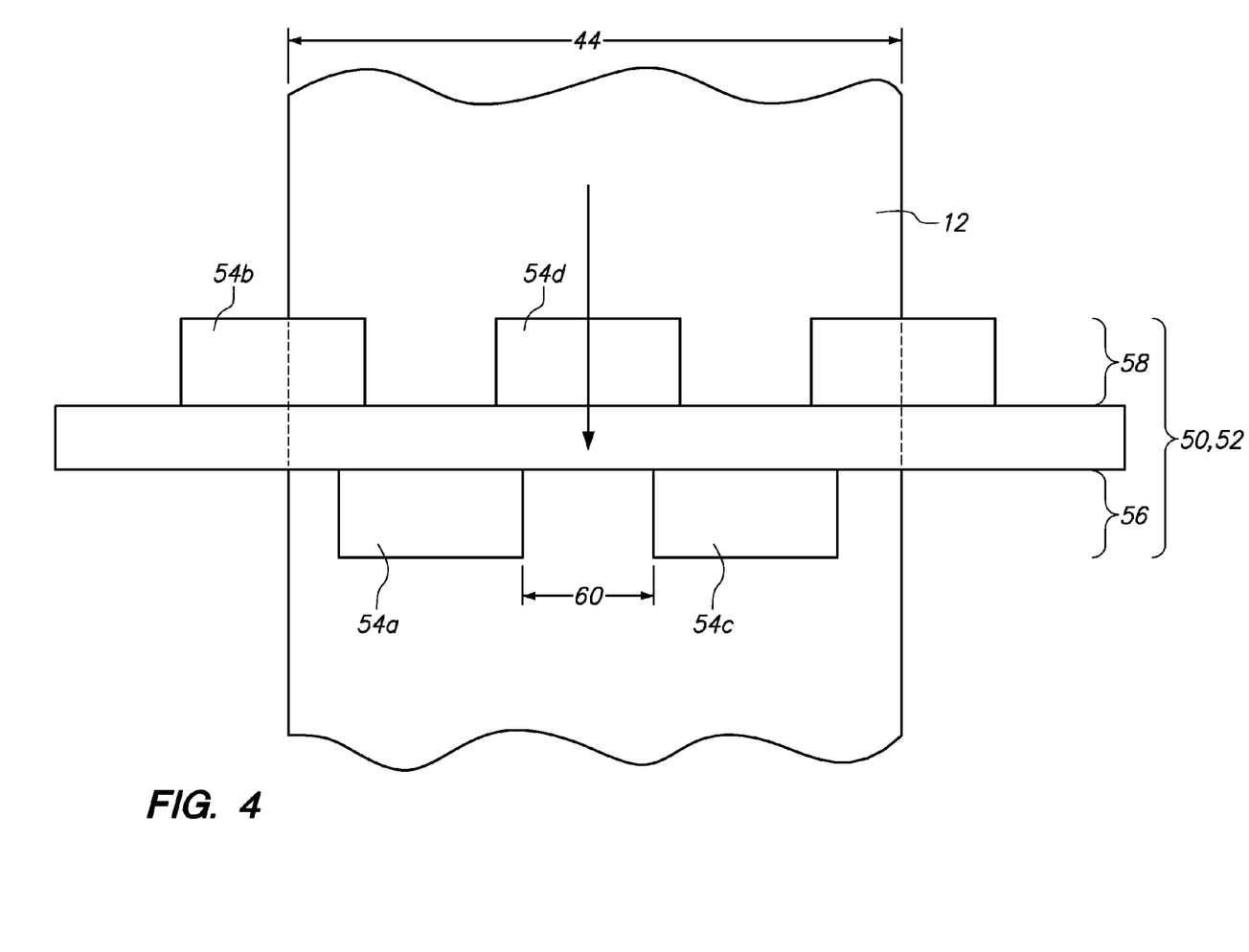
FIG. 4 is a top view of a second set of waveguides (or second probe station) for testing an E-field of the film.
Figure 5:
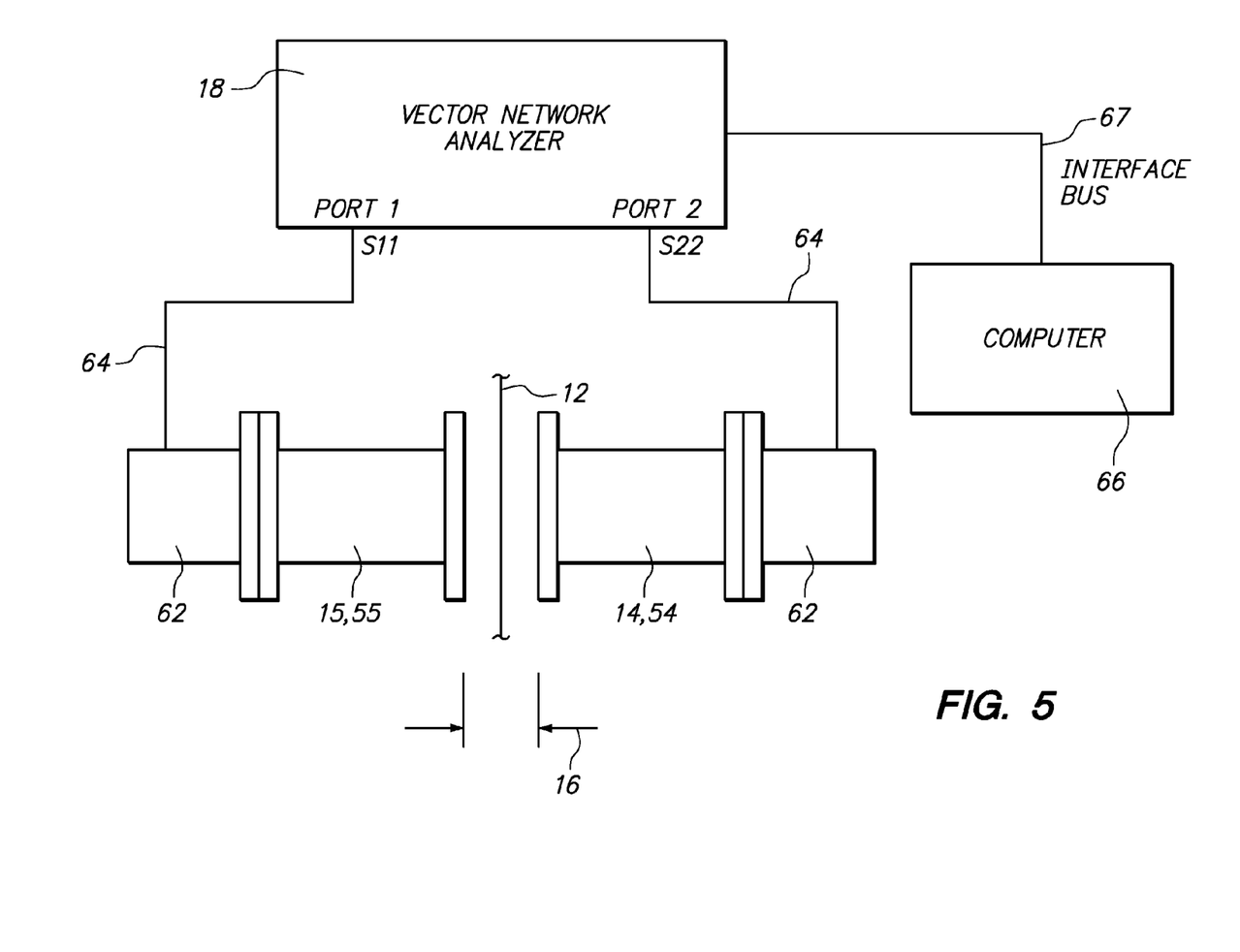
FIG. 5 is a schematic view of the waveguides in communication with a vector network analyzer and computer.
Figure 6:
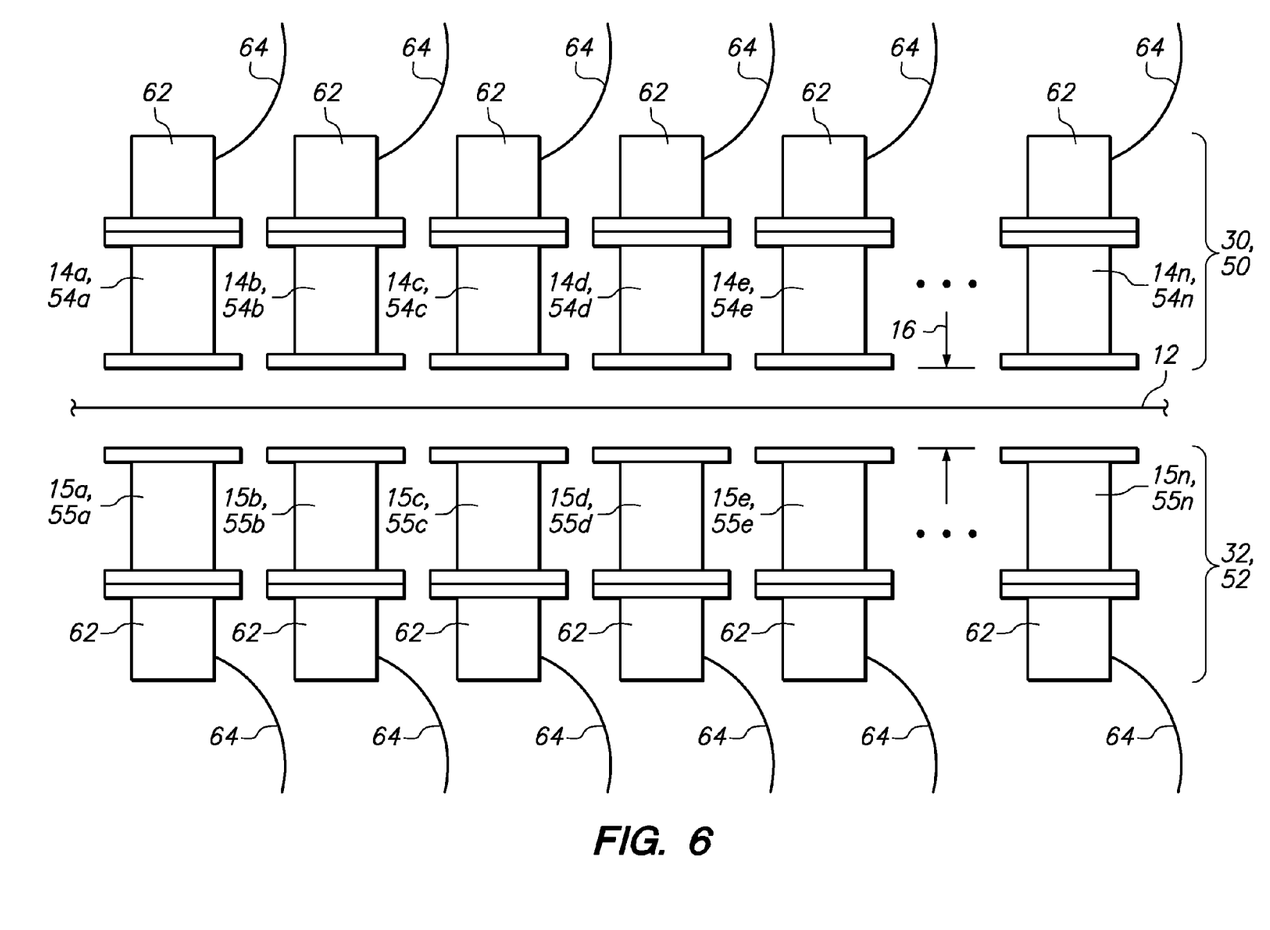
FIG. 6 is a schematic view of upper and lower arrays of waveguides.

The lower array 32 of waveguides 15a-n may be set up immediately below the waveguides 14a-n. For each upper waveguide 14a-n, a corresponding lower waveguide 15a-n is disposed immediately below the waveguide 14a-n, as shown in FIG. 2. The waveguide 14a-n and 15a-n may define a first probe station and may be set up so as to measure the H field of the film 12. Referring now to FIGS. 4 and 5, alternatively or additionally, an upper and lower array 50, 52 of waveguides 54a-n, 55a-n may define a second probe station and may be mounted to the stand 24 downstream or upstream of the upper and lower arrays 30, 32 of waveguides 14, 15. The lower array 32 of waveguides 14, 15 are not shown but may be placed immediately below the upper array 50 of the waveguides 54a-n. The upper array 50 of waveguides may be separated into two rows 56, 58. The first row 56 of waveguides 54a, c-n may be positioned adjacent to each other. Additionally, the adjacent waveguides 54a, c-n of the first row 56 may be gapped apart 60. The waveguides 54b, d-n of the second row 58 may be placed at the gaps 60 in order to measure resistivity of the film 12. The waveguides 55a-n may be positioned immediately below corresponding waveguides 54a-n. The waveguides 54a-n of the first and second rows 56, 58 may span the entire width 44 of the film 12. The waveguides 54a-n shown in FIG. 4 are set up to measure an orthogonal field, namely the E field of the film 12.

Referring now to FIG. 5, the waveguides 15, 14, 54, 55 of the upper and lower arrays 30, 32, 50, 52 may each be attached to a waveguide coax transition 62. The waveguide coax transition 62 may be connected to the vector network analyzer 18 by way of a coaxial cable 64. The vector network analyzer 18 measures the S-parameters of the film 12 and stores the data in computer 66. The computer 66 and the vector network analyzer 18 are in communication with each other via an interface bus 67.

Figure 7:
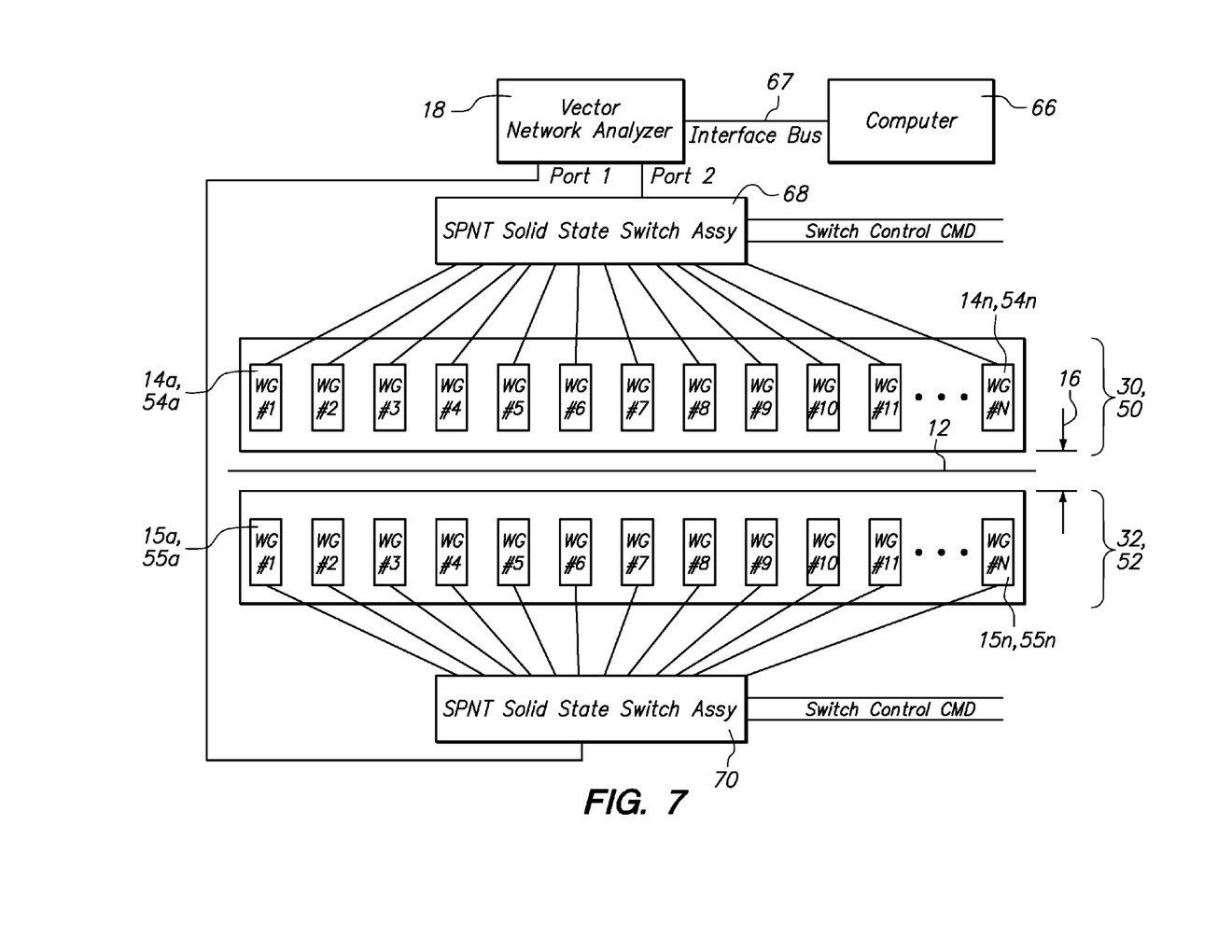
FIG. 7 is a schematic view of upper and lower arrays of waveguides controlled by a switch assembly to automate testing.

Referring now to FIG. 7, each of the waveguides 14a-n, 15a-n, 54a-n and 55a-n may be electrically connected to the vector network analyzer 18 by way of a switch assembly 68, 70. The switch assembly 68, 70 may be an SPNT solid state switch assembly in which the switch assembly 68, 70 activates one set of waveguides such as 14a, 15a or 54a, 55a at a time. When activated, the vector network analyzer 18 measures the S-parameter of the film 12 at the location of the activated waveguide. The S-parameters are sent to the computer 66 by way of interface bus 67. The S-parameters for the various waveguides are stored in the computer 66. The switch assemblies 68, 70 sequentially activate each pair of waveguides 14a-n and 15a-n and/or 54a-n and 55a-n until the entire width of the film 12 has been tested.

In operation, the system 10 is used to non-destructively test a resistive film 12. The system 10 may be set up with one (1) or two (2) sets of upper and lower arrays 30, 50, 32, 52 of waveguides 14, 15, 54, 55 depending on whether the E field, H field or both fields of the resistive film 12 is to be tested by the system 10. The film 12 is fed between the upper and lower arrays 30, 50, 32, 52 of waveguides 14, 15, 54, 55 and mounted to both rollers 26, 36 which are advanceable in unison by stepper motors 28, 38. The rollers 26, 36 pull the film 12 taut therebetween to suspend the film 12 between the upper and lower arrays 30, 50, 32, 52 of the waveguides 14, 15, 54, 55 without touching the waveguides 14, 15, 54, 55, as shown in FIG. 2. The distance 16 between the waveguides 14, 15, 54, 55 can be adjusted by way of adjustment nuts 42. Preferably, the distance 16 between the waveguides 14, 15 and 54, 55 are brought as close together to each other as possible to the extent that the film 12 does not contact the waveguide 14, 15, 54, 55 when the film 12 is being tested or when the film 12 is being advanced.

Once the film 12 is set up, the vector network analyzer 18 and computer 20 test the film 12 to determine the sheet resistance. The film 12 is not moved at the time the tests are conducted. The film 12 is only being tested at the local area of the foot print of the waveguide 14, 15, 54, 55. After testing, the data is sent by the vector network analyzer 18 to the computer 20. The stepper motors 28, 38 advance film 12 through the upper and lower arrays 30, 50, 32, 52 a predetermined distance (e.g., 12", 24", 36", x"). The film 12 is retested after being advanced x". The film 12 is tested until the film 12 is transferred from the roller 26 to the roller 36. Throughout the testing phase, it is possible to test the entire roll of film 12 without destroying the film's resistivity characteristics since the waveguides 14, 15, 54, 55 do not contact the film 12 during testing. Accordingly, it is possible to produce resistive film 12 of longer length.

The waveguides 14, 15, 54, 55 may be a waveguide straight. The waveguides may also have other configurations such as square, round, etc.

The film 12 shown in FIG. 1 is tested in a horizontal orientation. However, it is also contemplated that the system 10 may be fabricated so that the waveguides 14, 15, 54, 55 provide a vertical opening instead of a horizontal opening. In this manner, the film 12 may be tested while in a vertical orientation. Other orientations are also contemplated.

Referring back to FIGS. 3 and 4, the waveguides 14, 15, 54 and 55 extend across the width of the film 12. The size of the waveguide 14, 15, 54 and 55 or the waveguide's footprint may first be determined. If a smaller waveguide is utilized for testing, then the number of waveguides 14, 15, 54 and 55 may be increased to ensure coverage of the width of the film 12. If a larger waveguide is utilized for testing, then the number of waveguides 14, 15, 54 and 55 may be decreased yet still cover the width of the film 12. It is contemplated that the size or footprint of the waveguide may dictate the selection of the waveguide and the RF frequency to be tested. Alternatively, the selection of the waveguide may be a function of the desired RF frequency to be tested. In other words, the desired RF frequency to be tested may dictate the selection of the waveguide to be used in the system.

The above description is given by way of example, and not limitation. Given the above disclosure, one skilled in the art could devise variations that are within the scope and spirit of the invention disclosed herein, including various ways of advancing the film 12 forward. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A measurement system for testing a resistive film, the system comprising:
    a stationary first micro-waveguide;
    a stationary second micro-waveguide with respect to the stationary first micro-waveguide and gaped away from the first micro-waveguide, the film being disposable between the first and second micro-waveguides wherein the first and second micro-waveguides are spaced away about 0.030 inches to about 1 inch away from each other;
    a first spool rotating to unwind a roll of the film between the first and second micro-waveguides;
    a second spool rotating in sync with the first spool to rewind the roll of the film received from between the first and second micro-waveguides, one of the first and second micro-waveguides, one of the first and second spools rotating under power of a motor;
    a network analyzer in electrical communication with the first and second micro-waveguides for measuring S parameters of the film wherein the measured S parameters of the film are converted to a sheet resistance value to determine whether the sheet resistance of the film is within tolerance.

2. The measurement system of claim 1 wherein the first and second micro-waveguides are oriented vertically so that the film is placed in a horizontal orientation between the first and second micro-waveguides.

3. The measurement system of claim 1 wherein the first and second micro-waveguides are mounted to a bench.

4. The measurement system of claim 3 further comprising an E field set of first and second micro-waveguides and an H field set of first and second micro-waveguides, all mounted to the bench.

5. The measurement system of claim 1 further comprising an array of first micro-waveguides, the array of first micro-waveguides having upstream and downstream rows of first micro-waveguides, the upstream row of first micro-waveguides disposed at a gap formed between two micro-waveguides of the downstream row of first micro-waveguides.

6. The measurement system of claim 5 further comprising an array of second micro-waveguides corresponding to the array of first micro-waveguides, the array of second micro-waveguides disposed opposite the film.

7. A method of measuring resistivity of a resistive film, the method comprising the steps of:
    disposing the resistive film between first and second stationary micro-waveguides gapped away from each other about 0.030 inch to about 1 inch;
    adjusting the film so that the film is spaced away from the first and second stationary micro-waveguides;
    measuring sheet resistance of the film with the first and second stationary micro-waveguides while the film is spaced away from the first and second stationary micro-waveguides;
    feeding the film between the first and second stationary micro-waveguides by rotating a first spool to unwind a roll of the film between the first and second stationary micro-waveguides and rotating a second spool at the same rate as the first spool to rewind the roll of the film received from between the first and second micro-waveguides, one of the first and second spools rotating under power of a motor.

8. The method of claim 7 wherein the measuring step comprises the steps of:
    measuring an E field with an E field set of first and second micro-waveguides; and
    measuring an H field with an H field set of first and second micro-waveguides.

* * * * *